United States Patent
Herbsommer et al.

(10) Patent No.: US 8,546,925 B2
(45) Date of Patent: Oct. 1, 2013

(54) SYNCHRONOUS BUCK CONVERTER HAVING COPLANAR ARRAY OF CONTACT BUMPS OF EQUAL VOLUME

(75) Inventors: Juan A. Herbsommer, Schnecksville, PA (US); Osvaldo J. Lopez, Annandale, NJ (US); Jonathan A. Noquil, Bethlehem, PA (US); David Jauregui, Bethlehem, PA (US); Mark E. Granahan, Allentown, PA (US)

(73) Assignee: Texas Instruments Incorporated, Dallas, TX (US)

( * ) Notice: Subject to any disclaimer, the term of this patent is extended or adjusted under 35 U.S.C. 154(b) by 19 days.

(21) Appl. No.: 13/247,174

(22) Filed: Sep. 28, 2011

(65) Prior Publication Data

US 2013/0075893 A1    Mar. 28, 2013

(51) Int. Cl.
*H01L 23/02* (2006.01)
(52) U.S. Cl.
USPC ............ 257/678; 257/685; 257/E23.069; 257/E25.005; 257/E25.011; 257/E25.012; 257/E25.016; 257/E25.02; 257/E25.026
(58) Field of Classification Search
USPC ............ 257/678–734, E23.001–E23.194, 257/737, 738, 773–787, E25.005, E25.011, 257/E25.012, E25.016, E25.02, E25.026, 257/E25.015, E23.021, E23.069; 438/107, 438/110
See application file for complete search history.

(56) References Cited

U.S. PATENT DOCUMENTS

| | | | |
|---|---|---|---|
| 6,624,522 B2 | 9/2003 | Standing et al. | |
| 7,166,496 B1 | 1/2007 | Lopez et al. | |
| 7,176,506 B2 * | 2/2007 | Beroz et al. | 257/232 |
| 7,397,137 B2 | 7/2008 | Larking | |
| 7,504,733 B2 | 3/2009 | Lopez | |
| 7,579,697 B2 | 8/2009 | Larking | |
| 8,174,103 B2 * | 5/2012 | Bartley et al. | 257/685 |
| 2004/0169266 A1 * | 9/2004 | Maxwell | 257/684 |
| 2007/0096274 A1 | 5/2007 | Pavier et al. | |

* cited by examiner

*Primary Examiner* — Jasmine Clark
(74) *Attorney, Agent, or Firm* — Steven A. Shaw; W. James Brady; Frederick J. Telecky, Jr.

(57) ABSTRACT

A packaged power supply module (100) comprising a chip (110) with a first power field effect transistor (FET) and a second chip (120) with a second FET conductively attached side-by-side onto a conductive carrier (130), the transistors having bond pads of a first area (210) and the carrier having bond pads of a second area (230) smaller than the first area. Conductive bumps (114, 115, 124, 125) attached to the transistor bond pads and conductive bumps (126) attached to the carrier bond pads have equal volume and are coplanar (150), the bumps on the transistor pads having a first height and the bumps on the carrier pads having a second height greater than the first height.

15 Claims, 5 Drawing Sheets

SYNCHRONOUS BUCK CONVERTER HAVING COPLANAR ARRAY OF CONTACT BUMPS OF EQUAL VOLUME

FIELD OF THE INVENTION

The present invention is related in general to the field of semiconductor devices and processes, and more specifically to the system structure and fabrication method of thin, thermally efficient power supply modules having a coplanar array of contact bumps of equal volume.

DESCRIPTION OF RELATED ART

Among the popular families of power switching devices are the DC-DC power supply circuits, especially the category of Switched Mode Power Supply circuits. Particularly suitable for the emerging power delivery requirements are the synchronous Buck converters with two power MOS field effect transistors (FETs) connected in series and coupled together by a common switch node. In the Buck converter, the control FET chip is connected between the supply voltage $V_{IN}$ and the LC output filter, and the synchronous (sync) FET chip is connected between the LC output filter and ground potential. The gates of the control FET chip and the sync FET chip are connected to a semiconductor chip including an integrated circuit (IC) acting as the driver of the converter; the driver, in turn, is connected to a controller IC.

For many of today's power switching devices, the chips of the power MOSFETs and the chip of the driver and controller IC are assembled as individual components. The devices use a metallic leadframe, which typically has a rectangular pad surrounded by leads. The pad serves as substrate for attaching the semiconductor chip and the leads serve as output terminals. The leads are commonly shaped without cantilever extensions, and arranged in the manner of Quad Flat No-Lead (QFN) or Small Outline No-Lead (SON) devices. The electrical connections from the chips to the leads can be provided in several ways. In one family of devices, the connections are provided by bonding wires, which may introduce, due to their lengths and resistances, significant parasitic inductance into the power circuit. Each assembly is typically packaged in a plastic encapsulation, and the packaged components are employed as discrete building blocks for board assembly of power supply systems. In other device families, metal clips substitute for many or all connecting wires. These clips are wide and introduce smaller parasitic inductance and resistance compared to wires.

In other power switching devices, the power MOSFET chips and the driver-and-controller IC are assembled horizontally side-by-side on a leadframe pad, which in turn is surrounded on all four sides by leads serving as device output terminals. The leads are shaped in QFN or SON fashion. The electrical connections between the chips and the leads are provided by bonding wires. The devices are packaged in a plastic encapsulation.

Devices of these families are several millimeters thick. In order reduce the device thickness to about 1.5 mm, another recently introduced power MOSFET assembly avoids connecting clips and wire bonds by providing a leadframe with an assembly pad divided into two portions for a power chip with a first and a second terminal on one chip side and a third terminal on the opposite chip side. The chip is flip-assembled (using metal bumps or solder paste dispensed from a syringe) onto the leadframe pad so that the first terminal is contacting one pad portion and the second terminal is contacting the other pad portion. Both leadframe portions have rims bent so that, after the flip-assembly, the rims become coplanar with the third terminal; all three MOSFET terminals can thus be attached to a printed circuit board (PCB). After this attachment, the leadframe pad is remote from the PCB, but since it is divided into two portions serving two chip terminals, a heat sink cannot be attached to the pad.

In still another recently introduced power MOSFET assembly, connecting clips and wire bonds are avoided by providing a leadframe with an assembly pad divided into two portions for a power chip with a first and a second terminal on one die side and a third terminal on the opposite die side. The chip is flip-assembled (using metal bumps or solder paste dispensed from a syringe) onto the leadframe pad so that the first terminal is contacting one pad portion and the second terminal is contacting the other pad portion. Both leadframe portions have rims bent so that, after the flip-assembly, the rims become coplanar with the third terminal; all three MOSFET terminals can thus be attached to a printed circuit board (PCB). After this attachment, the leadframe pad is remote from the PCB, but since it is divided into two portions serving two die terminals, a heat sink cannot be attached to the pad.

In still another recently introduced power MOSFET package, a leadframe is provided with a flat pad divided into two portions, which can be attached to a PCB. The first and the second terminals of a power chip are attached to these pad portions. The third chip terminal, remote from the leadframe pad, is contacted by a metal clip, which has a rim bent towards a lead of the leadframe, allowing all three chip terminals to be assembled on the PCB. The clip is made of a metal thick enough to permit the attachment of a heat sink to the clip for cooling the third chip terminal. The MOSFET package thus has a three-strata structure of leadframe-chip-clip.

Another recently proposed power MOSFET package reduces the device thickness to 1.0 to 1.5 mm by a package structure without wire bonds or clips. The structure requires that the leadframe pad is half-etched to create a thicker and a thinner portion. This means, the leadframe cannot be stamped. During the chip assembly process, the coplanar side of the pad is facing downward. As another requirement, a special flip-chip equipment needs to be developed, which is capable of attaching the chip from the bottom; the FET source is attached to the thicker pad portion and the FET gate to the thinner pad portion. This thinner portion is covered with packaging compound during the encapsulation process. In addition, separate piece parts are needed to level the package terminals with the FET drain and an extra metal layer may have to be deposited and patterned to mimic the standard QFN footprint.

SUMMARY OF THE INVENTION

Applicants recognized that widespread applications of power converters in markets as diverse as handheld, laptop, automotive, and medical products require packages for MOS field effect transistors (FETS) and converters, which are extremely thin (less than 1.5 mm) yet still offer thermal and electrical efficiencies close to the theoretical maximum. In addition, the ongoing cost pressure calls for radical reduction of package parts and process steps. Applicants saw that the three-strata structures of existing MOSFET packages, combining the thicknesses of a leadframe, a chip and a clip, are too thick for many emerging applications. In addition, these devices tend to be burdened with parasitic electrical and thermal resistances and thus fall way short of reaching maximum thermal and electrical efficiencies. As an additional emerging need for customer-friendly usage, applicants recognized that power FET packages should preferably permit direct implementation into printed circuit boards (PCB) without the headache of first modifying a footprint.

Applicants solved the problem of reducing the overall thickness of high power MOSFET packages and of minimizing the fabrication cost, when they discovered a two-strata assembly of two FET chips attached side-by-side onto a low-cost, conductive flat carrier and connectable to a PCB by coplanar conductive bumps. The resulting package has all terminals on one side of the carrier and provides the opposite carrier side for attaching a heat sink. The conductive bumps preferably originate from solder balls of equal volume, which have been jetted onto bond pads exhibiting a first area for the FETS and a smaller second area for the carrier. The pad areas are selected so that after solder reflow, the apexes of the resulting convex bump surfaces are inversely proportional to the pad areas and are situated in a common plane (bumps are coplanar). Since encapsulation is optional, the molding process can be eliminated.

Applicants further found that the assembly without leadframe and clips reduces parasitic resistances and inductances, leading to increased efficiency and velocity. As an unexpected benefit, applicants found that a package without an extended clip and bent rim reduces the disturbing "ringing" of the switch node voltage.

In an exemplary embodiment, the FET power switch package, as determined by the dimensions of the carrier, has a length of 5 mm and a width of 2.5 mm. The carrier has a thickness of 0.25 mm. The carrier bond pads, surrounded by solder mask material, have an area of about 0.07 mm$^2$, as provided by a circle of 0.3 mm diameter. The first FET, the synchronous or low-side transistor, has a size of 2.48 by 2.1 mm, a thickness of 0.05 mm, and is conductively attached drain-down on the carrier; the thickness of the attach layer is 0.02 mm. The exposed bond pads for source and gate have an area of about 0.18 mm$^2$, as provided by a circle of 0.48 mm diameter. The second FET, the control or high-side transistor, has a size of 1.05 by 2.1 mm, a thickness of 0.05 mm, and is conductively attached source-down on the carrier, adjacent to the first FET; again, the thickness of the attach layer is 0.02 mm. The exposed bond pads for drain and gate have an area of about 0.18 mm$^2$, as provided by a circle of 0.48 mm diameter.

It is a technical advantage that the bond pad positions for the synchronous and the control FET can be selected to fit an established footprint. Alternatively, the pads can be arrayed in an orderly pattern of lines and rows.

A solder ball (for instance tin/silver alloy) of 0.3 mm diameter, resulting in a volume of about 0.014 mm$^3$, is deposited on each bond pad using a low cost jetting technique. Thereafter, the solder balls are reflowed so that the liquefied solder covers the pad areas and forms by surface tension a bump with a convex surface and an apex. The heights of the apexes over the pad areas are inverse proportional to the diameter of the pad areas, since all bumps have equal solder volume. For the pad diameters quoted above, the bump height over the FET pads is 0.15 mm, the bump height over the carrier pads is 0.22 mm. The difference of 0.07 mm between the bump heights compensates for the sum of the chip thickness (0.05 mm) and the attachment layer (thickness (0.02 mm). As a consequence of the different bump heights, all bump apexes are positioned on a common plane; the bumps are coplanar. Before assembling the packaged power supply module to a PBC, the thickness of the module is 0.47 mm, the sum of the carrier thickness (0.25 mm) and the carrier solder bump heights (0.22 mm).

It is a technical advantage that the exposed metal of the carrier side opposite to the assembled FETs is available for attachment of a heat sink. With the heat sink attached to the carrier, the exemplary module can handle currents up to 35 A.

DETAILED DESCRIPTION OF THE PREFERRED EMBODIMENTS

Figure 1:
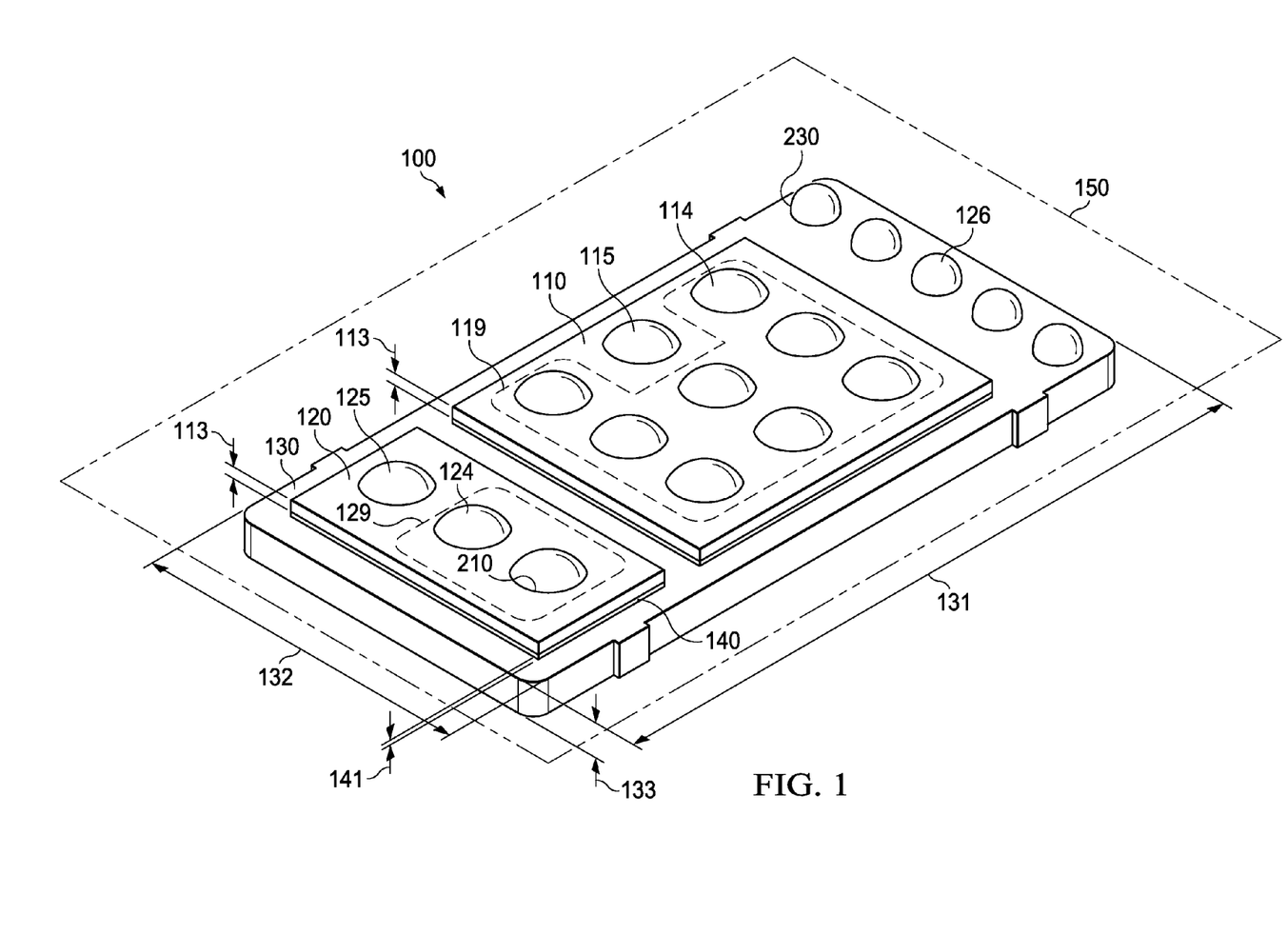
FIG. 1 is a perspective view of the bottom side of a packaged power supply module according to an embodiment of the invention, illustrating two power FET chips assembled on a carrier. Chips and carrier have coplanar solder bumps of equal volume but of different heights on different area contact pads. The FET chips have the same thickness.
Figure 2:
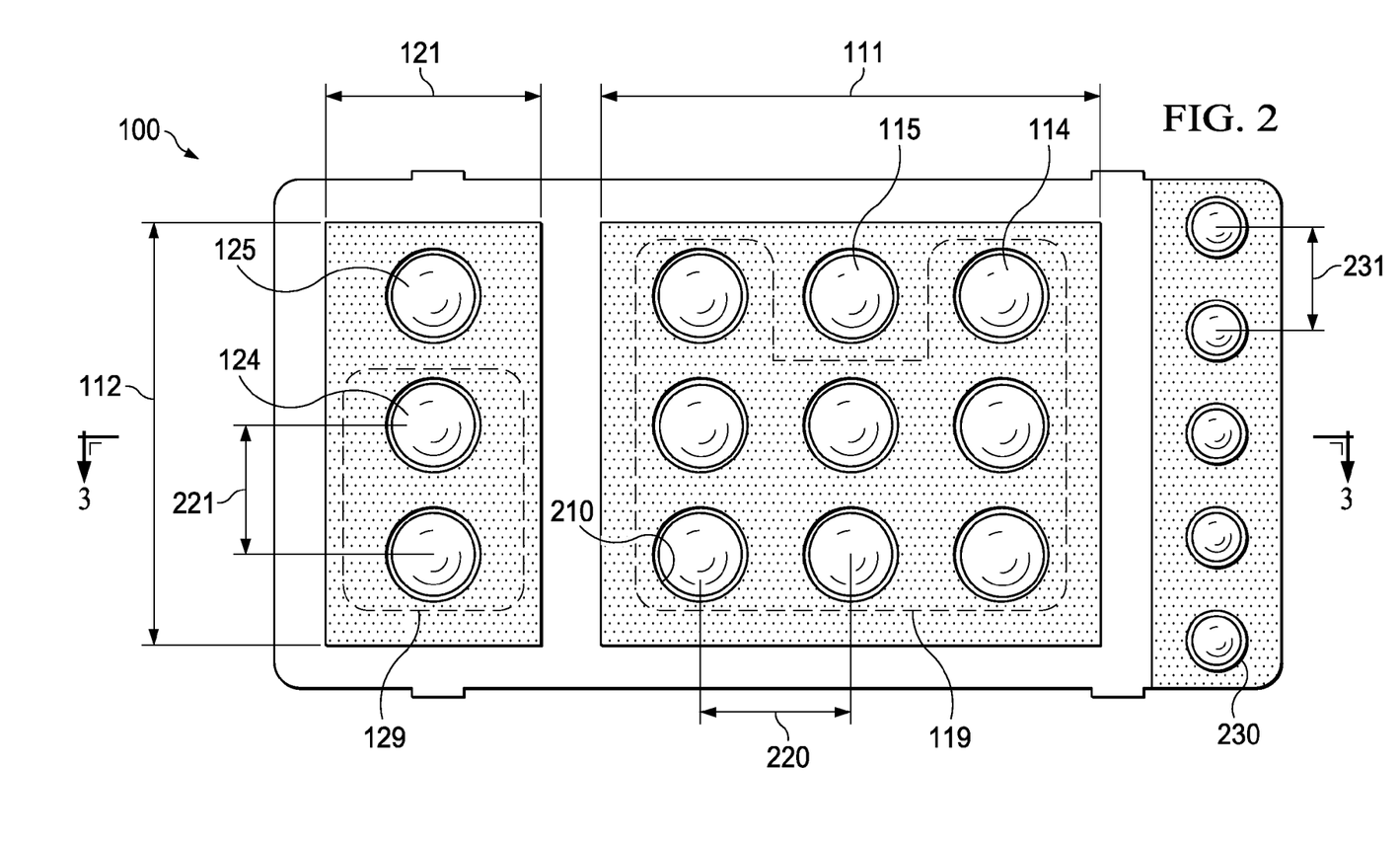
FIG. 2 depicts a top view of the module of FIG. 1. The phantom lines indicate the position of the module cutaway displayed in FIG. 3.
Figure 3:
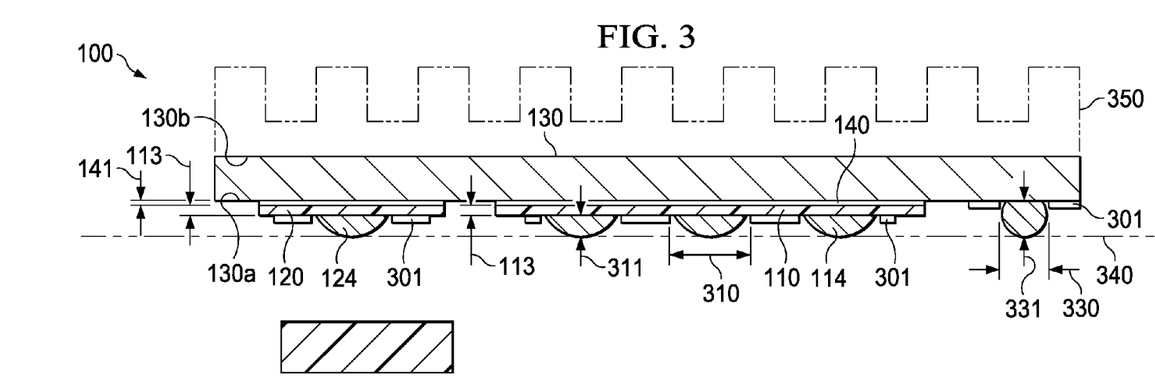
FIG. 3 illustrates a cross section vertically through the plane of view of FIG. 2, revealing the structure of a power supply module as an embodiment of the invention.

FIGS. 1, 2, and 3 illustrate an exemplary embodiment of the invention, the packaged building block, generally designated 100, of a synchronous Buck converter. A first semiconductor FET chip 110 and a second semiconductor FET chip 120 are assembled on a carrier plate 130. As FIG. 1 shows, the assembly is side-by-side and at close proximity. The assembly layer, designated 140, has a thickness 141 (preferably about 0.02 mm) and is electrically and thermally conductive. In this example, chip 110 has a larger area than chip 120, because chip 110 includes the synchronous (low side) transistor (sync FET) of the module and chip 120 includes the control (high side) transistor (control FET) of the module. In the example of FIG. 1, chip 110 and chip 120 has equal thickness 113, preferably about 0.05 mm; in other embodiments, the chip 110 and chip 120 may have different thicknesses, and the value may be larger or smaller than 0.05 mm.

With regard to a comparison of the physical areas and active areas of the sync and control FETS, it should be noted that the duty cycle of a synchronous Buck converter determines the ratio of the active areas needed for the control FET relative to the sync FET, since the resistance $R_{ON}$ of the ON state is inversely proportional to the active chip area. If the anticipated duty cycle is low most of the time (<0.5), the control FET is off and not conducting during most of the operation; and the sync FET is conducting most of the cycle time. To reduce conduction losses of the Buck converter, $P_{LOSS}=I^2 R_{ON}$, it would be favorable to have the sync FET chip 110 with an active area equal to or larger than the active area of the control FET chip 120. Consequently, the sync chip 110 also has a physical area equal to or larger than the physical area of the control chip 120.

In the example of FIGS. 1, 2, and 3, first power FET 110 has a length 111 of 2.48 mm and a width 112 of 2.1 mm. Second power FET 120 has a length 121 of 1.05 mm and the same width 112 of 2.1 mm as first transistor 110. In the exemplary converter 100, first FET has its drain conductively attached to carrier 130 and the second FET has its source conductively attached to carrier 130. Both transistors 110 and 120 have a plurality of bond pads of a first area, populated by attachment bumps. In the example of converter 100, the first bond pad area is about 0.18 mm$^2$, as provided by a circle of 0.48 mm diameter. The circular FET pad shape and area are designated 210 in FIG. 2, the FET pad diameter is designated 310 in FIG. 3. Carrier 130 has a plurality of bond pads of a second area smaller than the first area, also populated by attachment bumps. In the example of converter 100, the second bond pad area is about 0.07 mm$^2$, as provided by a circle of 0.3 mm diameter. The circular carrier pad shape and area are designated 230 in FIG. 2, the carrier pad diameter is designated 330 in FIG. 3.

The perimeters of the bond pads areas are determined by openings in an insulating, non-solderable coating such as soldermask, which surrounds the bond pads (the coating is indicated by shading in FIG. 2 and designated 301 in FIG. 3). On the other hand, the bond pad areas have a surface conditioned so that conductive materials, such as conductive adhesives and solder, can be attached; as an example, the pad areas may have an affinity to solder (such as cleanliness) and can thus be wetted uniformly by solder.

All conductive bumps have the same volume. In the example of FIGS. 1, 2 and 3, the volume of a bump is about 0.014 mm$^3$, which can be realized, in the example of solder, by reflowing spherical solder balls of 0.3 mm diameter.

Carrier plate 130 has a length 131 and a width 132; the thickness of carrier 130 is designated 333. In the example of FIG. 1, length 131 is 5.0 mm and width 132 is 2.5 mm, and thickness 133 is about 0.25 mm. Plate 130 is electrically and thermally conductive, mechanically stiff, and is preferably made of copper or a copper alloy; alternatively, aluminum, steel, or other metal alloys are used. Carrier 130 has a surface 130a, which preferably has a solderable metallurgical configuration to facilitate the assembly of chips 110 and 120, and a parallel surface 130b (see FIG. 3). Both surfaces are preferably flat and smooth. In some embodiments, surface 130b is configured so that it facilitates heat transfer into the ambient; it is a technical advantage when surface 130b is suitable for attaching a heat sink, as indicated by the exemplary phantom line 350 in FIG. 3.

As stated above, transistors 110 and 120 have a plurality of bond pads of a first area, populated by conductive bumps for attachment to an external part such as a PCB, and carrier 130 has a plurality of bond pads of a second area smaller than the first area, also populated by conductive bumps. For synchronous FET 110, the conductive bumps for the transistor source terminal are designated 114; the population of source bumps is delineated by phantom line 119. The bump for the transistor gate terminal is designated 115. For control FET 120, the conductive bumps for the transistor train terminal are designated 124; the population of drain bumps is delineated by phantom line 129. The bump for the transistor gate terminal is designated 125. In the exemplary converter 100, it is advantageous to array the conductive bumps of the transistors and the carrier in an orderly pattern of rows and lines. Specifically, it is an advantage to array the transistor bumps in a standard footprint for attachment to a PCB. For vertical bump rows of the transistor 110, the exemplary converter of FIG. 2 shows a bump pitch 220 center-to-center of 0.72 mm. For horizontal bump lines of transistors 110 and 120, the exemplary converter of FIG. 2 shows a bump pitch 221 center-to-center of 0.65 mm. For the row of bumps (126) of carrier 130, the exemplary converter of FIG. 2 shows a bump pitch 231 of 0.5 mm. In other embodiments, bond pads and bumps may be arranged more arbitrarily.

Figure 4:
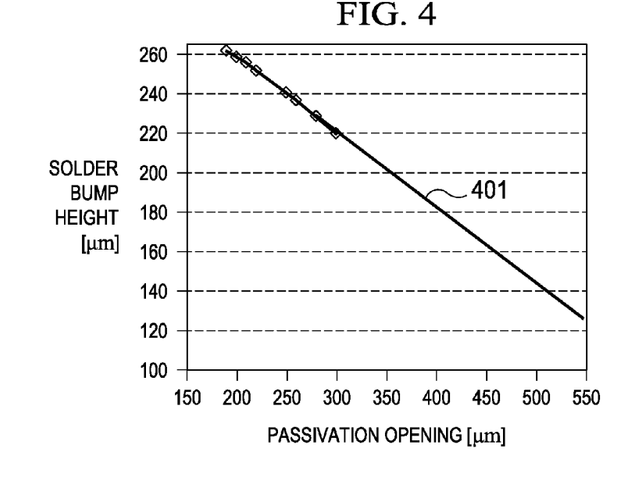
FIG. 4 is a diagram displaying the relationship, for solder bumps of equal volume, between the solder bump height (measured from the contact pad to the apex of the convex bump surface) and the diameter of the contact pad (determined by the opening in the non-solderable coating). The parameter of the relationship is the bump volume (0.014 mm$^3$). The relationship allows the bump apexes to be positioned on a common plane.

As stated above, all conductive bumps have the same volume. Under this condition and the fact that reflowing solder is wetting the whole area of the bond pad, the diagram of FIG. 4 illustrates the relationship between the area of the bond pad, represented by the diameter of circular passivation openings (abscissa of FIG. 4), and the apex of convex bump surfaces, represented by the height of the solder bump after reflow (ordinate of FIG. 4). The data of FIG. 4 show that the relationship between apexes and pad area is linear, indicated by line 401; the parameter is the bump volume, giving the line its slope. Consequently, the heights of the apexes over the pad areas are inverse proportional to the diameter of the pad areas since all bumps have equal solder volume.

The specific data of FIG. 4 is obtained for a solder bump volume of 0.014 mm$^3$. Such volume may be obtained by reflowing a solder sphere of 0.3 mm diameter. As an example of the process, a ball of tin/silver alloy is deposited on each bond pad, liquefied at the reflow temperature until the pad area is covered by solder. Surface tension forms the molten alloy into a convex surface with an apex. The bumps solidify when the solder temperature is lowered to ambient temperature. The data of FIG. 4 show as an example that bumps over the circular FET pad area of 0.18 mm$^2$, correlated to 0.48 mm pad diameter, have a height of 0.15 mm. This height of the FET bumps is designated 311 in FIG. 3. Data of FIG. 4 further show that bumps over the circular carrier pad area of 0.07 mm$^2$, correlated to 0.3 mm pad diameter, have a height of 0.22 mm. This height of the carrier bumps is designated 331 in FIG. 3.

The difference of 0.07 mm between the bump heights on the FET pad area and the carrier pad area compensates for the sum of the chip thickness (0.05 mm) and the attachment layer (thickness 0.02 mm). For calculating the height at the FETS, beginning at surface 130a of carrier 130, a layer of thickness 141 (0.02 mm) of an adhesive material attaches FET chips 110 and 120 of thickness 113 (0.05 mm) side-by-side onto carrier surface 130a. FET bumps show at the apex a height 311 of 0.15 mm. Consequently, the total height at the FETS is 0.22 mm. This is the same height as the carrier bump height 331 quoted above.

As a consequence of the different bump heights, all bump apexes are situated on a common plane, designated 150 in FIG. 1. The bumps are coplanar. The fact of coplanarity is illustrated in FIG. 3 by phantom line 340.

The feature of bump coplanarity enables high-yield attachment of converter 100 to a PCB. Converter 100 is turned upside down (flipped) and aligned with the surface of the PCB until plane 340 is parallel with the PCB surface. Converter 100 is then lowered onto the PCB until plane 340 coincides with the PCB surface, whereby all flipped bump vertexes touch the PCB surface. All bumps are ready to be simultaneously attached to the PCB surface.

In other embodiments, the FET chips may not have equal thickness. In order to obtain bump coplanarity for bumps of equal volume, the contact areas for the bumps have to be different for the first FET compared to the second FET. When both FETS are mounted on a flat carrier (on a carrier surface in a plane), the contact areas of the thinner chip have to be smaller compared to the contact areas of the thicker chip (see also FIG. 4).

The methodology illustrated in FIGS. 1 to 4 to achieve coplanarity of connecting bumps by inversely correlating bump heights with bump attachment areas for bumps of equal volume, can be generalized to any carrier, which has a surface with a plurality of contact pads not situated on a common plane. As an example, the carrier may have a surface with steps so that the contact pads are located on different planes. For such carrier, a supply of bodies of equal volume is provided, wherein the bodies' material is suitable to create connections. One body from this supply is selected to be attached to each contact pad. The attachment is performed so that the body's material spreads over the respective pad area and forms a bump with a convex surface including an apex. When the pad areas are inversely correlated with the apexes of the respective bumps, the apexes of all bumps of equal volume will be situated on a common plane; the bump apexes are coplanar.

Figure 5:
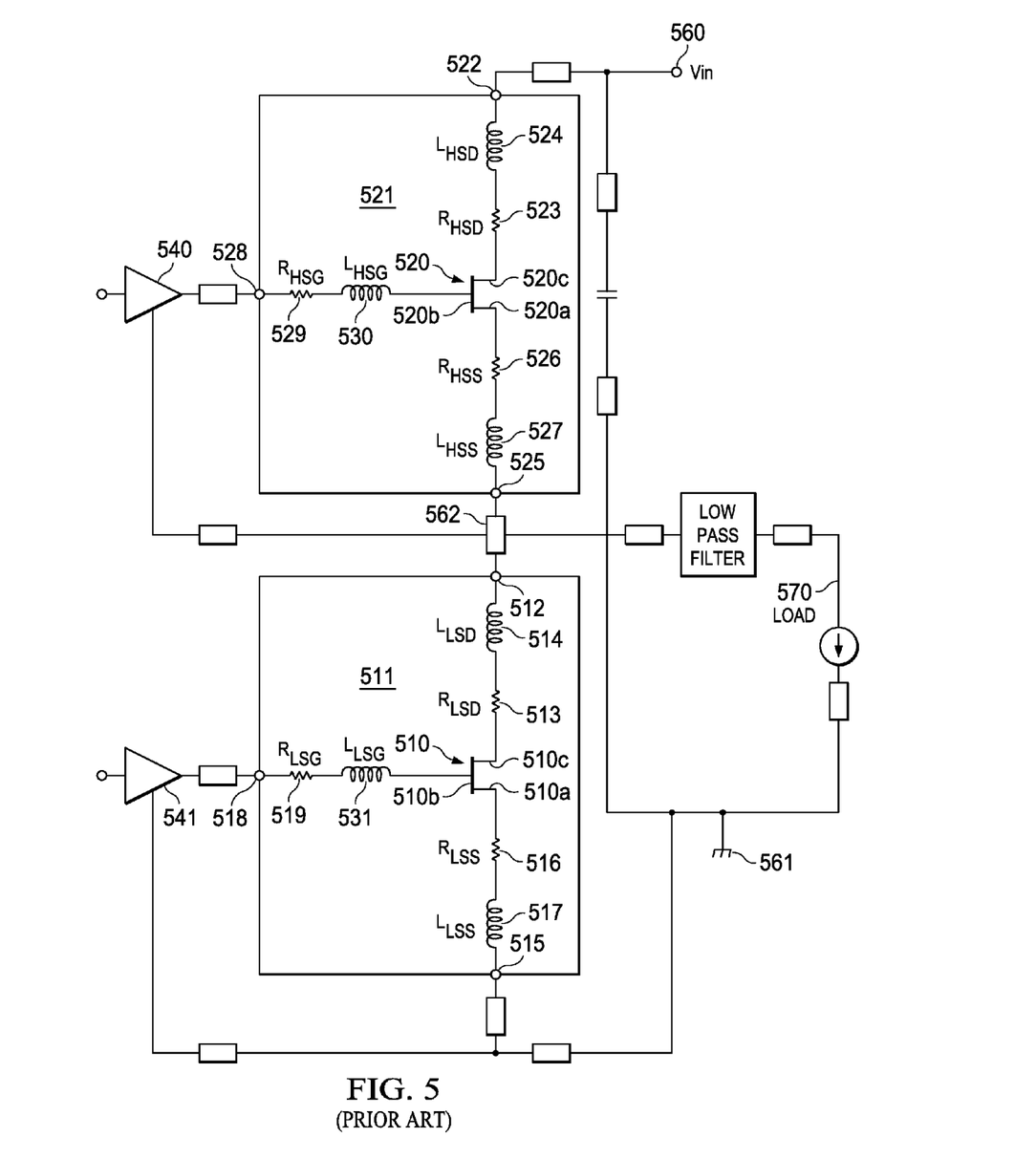
FIG. 5 is a circuit diagram of a synchronous Buck converter with two power field-effect transistors (FETS) assembled side-by-side in prior art.
Figure 6:
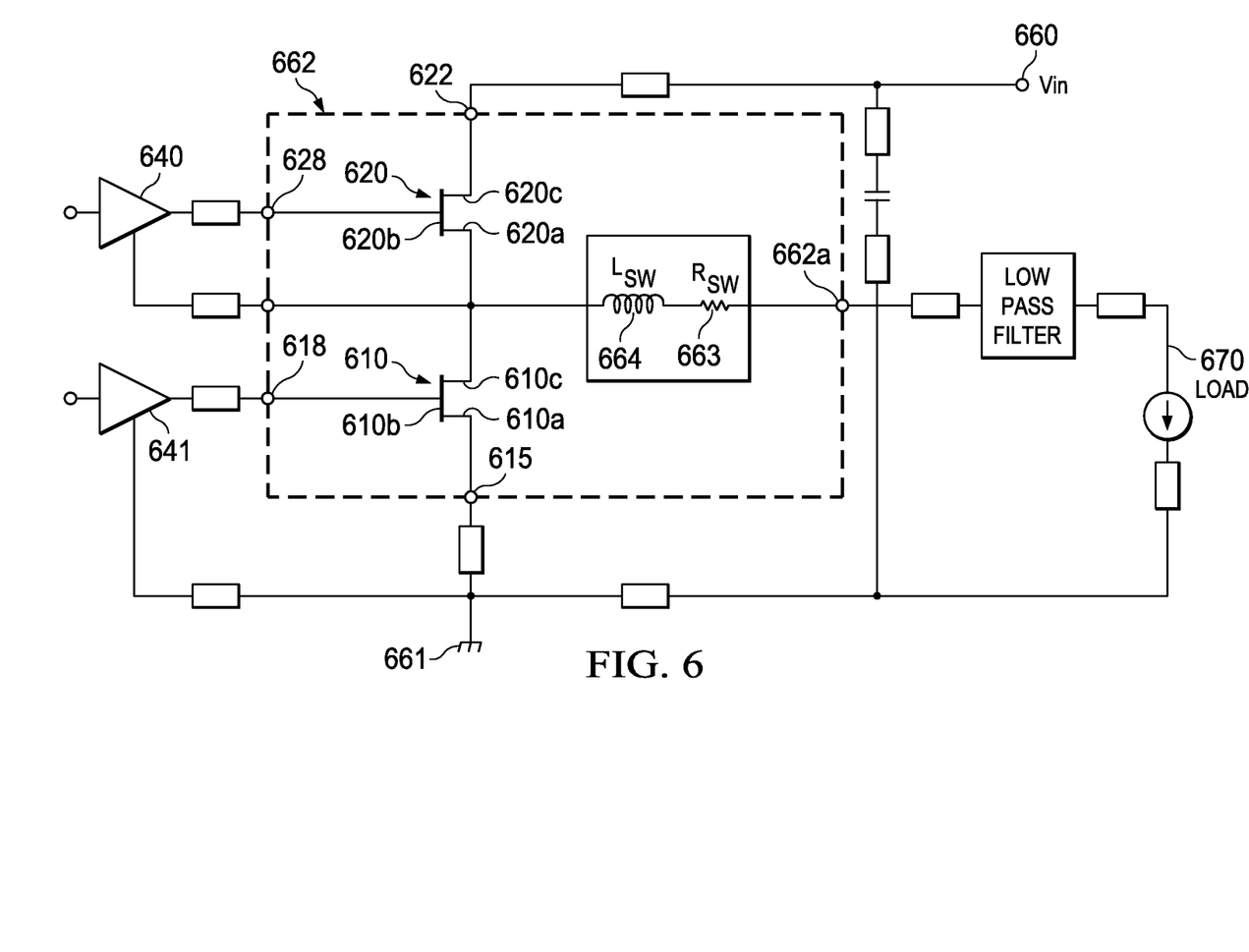
FIG. 6 depicts a circuit diagram of a synchronous Buck converter with two FETS assembled side-by-side according to the invention.

In order to summarize the electrical improvements of the exemplary converter package discussed in FIGS. 1 to 3 compared to conventional converter packages, the circuit diagram of FIG. 5 for a conventional synchronous Buck converter including two individually encapsulated power FETS 520 and 510 is compared to the circuit diagram of FIG. 6 of the converter as discussed in FIGS. 1 to 3 including un-encapsulated chips for power FETS 620 and 610. The goal of improving the efficiency of a synchronous Buck converter can be achieved by reducing the power loss:

efficiency = output power / input power

= output power / (output power − power loss).

The power loss in a synchronous Buck converter is determined by:

power loss=$I_L^2 R + P_{SW}$ (wherein $I_L$=load current, R=intrinsic resistance, $P_{SW}$=switching loss). Reducing the power loss and increasing the efficiency can be achieved by proceeding along two approaches: Reducing switching loss $P_{SW}$ and thus heat generation at the device level, and improving heat dissipation at the board level. $P_{SW}$ can be reduced by eliminating parasitic inductances and resistances existing in many places of FIG. 5 due to a methodology based on wire bonds, clips, and leadframe with a pad and leads (terminals) to assemble the control FET and sync FET chips. In addition, the possibility of attaching a heat sink to the unobstructed surface of the chip carrier supports effectively the heat dissipation at the board level.

In FIG. 5, the chip of high-side (control) FET 520 is enclosed by package 521. FET 520 has its drain 520c connected to package drain terminal 522, wherein the connection includes parasitic resistance $R_{HSD}$ (523) and parasitic inductance $L_{HSD}$ (524); terminal 522 in turn is tied to input terminal $V_{IN}$ (560). Further, FET 520 has its source 520a connected to package source terminal 525, wherein the connection includes parasitic resistance $R_{HSS}$ (526) and parasitic inductance $L_{HSS}$ (527); terminal 525 in turn is tied to the drain terminal 512 of the low-side (sync) FET package 511 and with trace 562 as switch node to load 570. Finally, FET 520 has its gate 520b connected to package gate terminal 528, wherein the connection includes parasitic resistance $R_{HSG}$ (529) and parasitic inductance $L_{HSG}$ (530); terminal 528 in turn is tied to driver and controller 540.

In FIG. 5, the chip of low-side (sync) FET 510 is enclosed by package 511. FET 510 has its drain 510c connected to package drain terminal 512, wherein the connection includes parasitic resistance $R_{LSD}$ (513) and parasitic inductance $L_{LSD}$ (514); terminal 512 in turn is tied to the source terminal 525 of high-side (control) FET package 521, and with trace 562 as switch node to load 570. Further, FET 510 has its source 510a connected to package source terminal 515, wherein the connection includes parasitic resistance $R_{LSS}$ (516) and parasitic inductance $L_{LSS}$ (517); terminal 515 in turn is tied to ground potential 561. Finally, FET 510 has its gate 510b connected to package gate terminal 518, wherein the connection includes parasitic resistance $R_{LSG}$ (519) and parasitic inductance $L_{LSG}$ (531); terminal 518 in turn is tied to driver and controller 541.

A comparison of the converter diagram in FIG. 5, based on conventional assembly, with the converter diagram in FIG. 6, based on assembly by the inventive concepts, illustrates the striking reduction of parasitic components of the converter. The package-related interconnect parasitic resistances 523, 526, 529, 513, 516, and 519, the switch node trace, and the package-related interconnect parasitic inductances 524, 527, 530, 514, 517, and 531 are all eliminated. Instead, in FIG. 6, the chip high-side (control) FET 620 and the chip of low-side (sync) FET 610 are attached side-by-side onto carrier 662 serving as switch node with very small parasitic resistance $R_{SW}$ (663) and very small parasitic inductance $L_{SW}$ (664). Using bump interconnects, the FET terminals have direct access to PBC traces: The drain 620c of high-side (control) FET 620 is by terminal bump 622 directly tied via a PBC trace to input terminal $V_{IN}$ (660); the source 610a of low-side (sync) FET 610 is by terminal bump 615 directly tied via s PBC trace to ground potential 661; the gate 620b of high-side (control) FET 620 is by terminal bump 628 directly tied via a PBC trace to driver and controller 640; the gate 610b of low-side (sync) FET 610 is by bump 618 directly tied via a PBC trace to driver and controller 641; and the carrier is by terminal bump/bumps 662a directly tied via a PBC trace to the load 670.

The compact configuration of the converter described in FIGS. 1 to 3 further enables tighter electrical loops including ground loops, and shorter PBC trace runs and interconnects, and thus reduced PBC parasitics. These diminished parasitics, together with the substantial parasitic eliminations in the converter package described above, result in reduced converter power losses and thus improved converter efficiency. These gains are further enhanced by the efficient cooling of the converter FET junctions through a heat sink attached to the unobstructed carrier surface as indicated in FIG. 3.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors.

As another example, the invention applies to surfaces, which have pads situated not in a single plane but in several planes, but still need to have these pads attached to a planar substrate. For coplanar connectors of the same volume, the pads areas have to be selected in inverse relation to the distance between pad and substrate.

It is therefore intended that the appended claims encompass any such modifications or embodiments.

We claim:
1. A packaged power supply module comprising:
a chip with a first power field effect transistor (FET) and a second chip with a second FET conductively attached side-by-side onto a conductive carrier, the transistors having bond pads of a first area and the carrier having bond pads of a second area smaller than the first area; and conductive bumps attached to the transistor bond pads and the carrier bond pads, the bumps having equal volume and being coplanar, the bumps on the transistor pads having a first height and the bumps on the carrier pads having a second height greater than the first height.

2. The module of claim 1 wherein the first and second chips have equal thickness.

3. The module of claim 2 wherein the transistor bond pads are in a first plane and the carrier bond pads are in a second plane spaced from the first plane, the space being about equal to the chip thickness.

4. The module of claim 3 wherein the difference between the second bump height and the first bump height is equal to the space between the first and the second plane.

5. The module of claim 1 wherein the carrier is a flat plate made of metal having a solderable surface.

6. The module of claim 5 wherein the metal includes copper or aluminum.

7. The module of claim 1 wherein the first and the second FET are attached to one carrier surface, while the opposite carrier surface is available for attaching a heat sink.

8. The module of claim 1 wherein the conductive bumps are solder.

9. The module of claim 8 wherein the solder bumps have a volume of about 0.014 mm3, as provided by solder balls of 0.3 mm diameter; a transistor bond pad area is about 0.18 mm2, as provided by a circle of 0.48 mm diameter; and a carrier bond pad area is about 0.07 mm2, as provided by a circle of 0.3 mm diameter.

10. The module of claim 1 wherein the FET bond pads and the carrier bond pads are surrounded by non-solderable coating.

11. The module of claim 10 wherein the non-solderable coating of the FET bond pads is compliant and thick enough to serve as stress-absorbing underfill between the bumps.

12. The module of claim 1 wherein the conductive bumps of the transistors are arrayed in an orderly pattern of lines and rows.

13. The module of claim 12 wherein the transistor bumps are arrayed in a standard footprint.

14. The module of claim 1 wherein the first FET has its drain conductively attached to the carrier and the second FET has its source conductively attached to the carrier.

15. The module of claim 14 wherein the first FET is the synchronous (low side) transistor of the module and the second FET is the control transistor (high side) of the module.

\* \* \* \* \*